United States Patent [19]
Reddy et al.

[11] Patent Number: 6,037,829
[45] Date of Patent: *Mar. 14, 2000

[54] LOOK-UP TABLE USING MULTI-LEVEL DECODE

[75] Inventors: Srinivas T. Reddy, Santa Clara; Anil Gupta, San Jose, both of Calif.

[73] Assignee: Altera Corporation, San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/591,121

[22] Filed: Jan. 25, 1996

Related U.S. Application Data

[63] Continuation of application No. 08/335,628, Nov. 8, 1994, abandoned, which is a continuation of application No. 08/076,712, Jun. 11, 1993, Pat. No. 5,438,295.

[51] Int. Cl.[7] .............................. H03K 17/62; G11C 8/00
[52] U.S. Cl. ............................................. 327/408; 326/106
[58] Field of Search ........................... 307/463; 328/104, 328/154, 117; 365/230.06, 230.02, 189.02; 327/407, 408, 110, 411, 106, 107; 326/113, 114, 106, 49, 50, 105

[56] References Cited

U.S. PATENT DOCUMENTS

| | | | |
|---|---|---|---|
| 3,551,900 | 12/1970 | Annis | 340/173 |
| 3,633,163 | 1/1972 | Birchmeier | 340/147 |
| 3,654,394 | 4/1972 | Gordon | 179/15 BL |
| 3,760,358 | 9/1973 | Isii et al. | 340/147 |
| 3,846,745 | 11/1974 | Hill et al. | 340/6 R |
| 3,885,167 | 5/1975 | Berglund | 307/221 |
| 3,992,703 | 11/1976 | Luisi et al. | 340/173 |
| 4,006,470 | 2/1977 | Mitarai | 340/173 |
| 4,103,349 | 7/1978 | Marmet | 365/321 |
| 4,308,526 | 12/1981 | Smith | 340/347 |
| 4,354,266 | 10/1982 | Cooperman et al. | 370/112 |
| 4,470,133 | 9/1984 | Tanimoto | 365/227 |
| 4,491,839 | 1/1985 | Adam | 340/825 |
| 4,670,748 | 6/1987 | Williams | 340/825.84 |
| 4,725,742 | 2/1988 | Tachimori et al. | 307/449 |
| 4,873,459 | 10/1989 | El Gamal et al. | 307/465 |
| 4,879,684 | 11/1989 | Krauss et al. | 365/189.11 |
| 4,910,466 | 3/1990 | Kuichi | 328/137 |
| 4,972,380 | 11/1990 | Hidaka et al. | 365/230 |
| 4,975,601 | 12/1990 | Steele | 307/465 |
| 5,021,689 | 6/1991 | Pickett et al. | 307/465 |

(List continued on next page.)

FOREIGN PATENT DOCUMENTS

| | | | |
|---|---|---|---|
| 0 281 867 | 9/1988 | European Pat. Off. | G11C 5/02 |
| 0 314 034 | 5/1989 | European Pat. Off. | H03K 19/173 |
| 0 415 542 A2 | 3/1991 | European Pat. Off. | |
| 24 31 326 | 1/1976 | Germany | 73/43 |

OTHER PUBLICATIONS

Yao, *High–Density Memory Selection Circuit,* (1972) IBM Technical Disclosure Bulletin, vol. 15. No. 7, pp. 2042–2044.

Davis et al., *Matrix Decoder,*(1976) IBM Technical Disclosure Bulletin, vol. 18, No. 8, pp. 2577–2578.

Author not listed, *Eight by Sixty–Four to One CMOS Switch Matrix Macro,* (1988) vol. 31, No. 5, pp. 316–317.

Kubinec, *Build a Programmable Word Generator with MOS ICs. Multiple Output* Channels Supply Easily Programmed 100–Bit Words at 1–MHz Bit Rate, (1969), Electronic Design, vol. 17, No. 2, pp. 62–.

*Primary Examiner*—William L. Sikes
*Assistant Examiner*—Heidi L. Eisenhut
*Attorney, Agent, or Firm*—Townsend and Townsend and Crew LLP

[57] ABSTRACT

A look-up table circuit implemented with MOS transistors that uses combinational logic to generate signals that enable the transistors. A circuit using 16 inputs and 4 select lines is disclosed. Two of the select lines are used as inputs to combinational logic including four NOR gates to generate enable signals for transistors in a third stage of the circuit. This produces a reduction in the propagation delay of a signal from the input to the output of the look-up table circuit.

35 Claims, 4 Drawing Sheets

U.S. PATENT DOCUMENTS

| | | | |
|---|---|---|---|
| 5,157,283 | 10/1992 | Kin | 307/449 |
| 5,162,666 | 11/1992 | Tran | 307/243 |
| 5,231,588 | 7/1993 | Agrawal et al. | 364/489 |
| 5,243,599 | 9/1993 | Barrett et al. | 327/407 |
| 5,280,202 | 1/1994 | Chan et al. | 327/407 |
| 5,309,045 | 5/1994 | Saeki et al. | 327/407 |
| 5,315,178 | 5/1994 | Snider | 307/465 |
| 5,343,406 | 8/1994 | Freeman et al. | 364/490 |
| 5,369,621 | 11/1994 | Mason | 365/230 |
| 5,432,719 | 7/1995 | Freemen et al. | 364/579 |
| 5,438,295 | 8/1995 | Reddy et al. | 327/408 |
| 5,488,316 | 1/1996 | Freeman et al. | 326/41 |

LOOK-UP TABLE USING MULTI-LEVEL DECODE

This is a Continuation of application Ser. No. 08/335,628, filed Nov. 8, 1994, now abandoned, which is a continuation of application Ser. No. 08/076,712, filed Jun. 11, 1993, now U.S. Pat. No. 5,438,295.

FIELD OF THE INVENTION

This invention relates generally to electronic look-up table circuits and specifically to a look-up table circuit that uses combinational logic to generate internal enable signals in a programmable logic array application.

BACKGROUND OF THE INVENTION

Look-up table circuits are well known in the art for selecting one of several signal inputs and passing the selected signal input to the output of the circuit. Look-up tables are widely used in applications such as communications, digital computing, control systems, etc.

Figure 1:
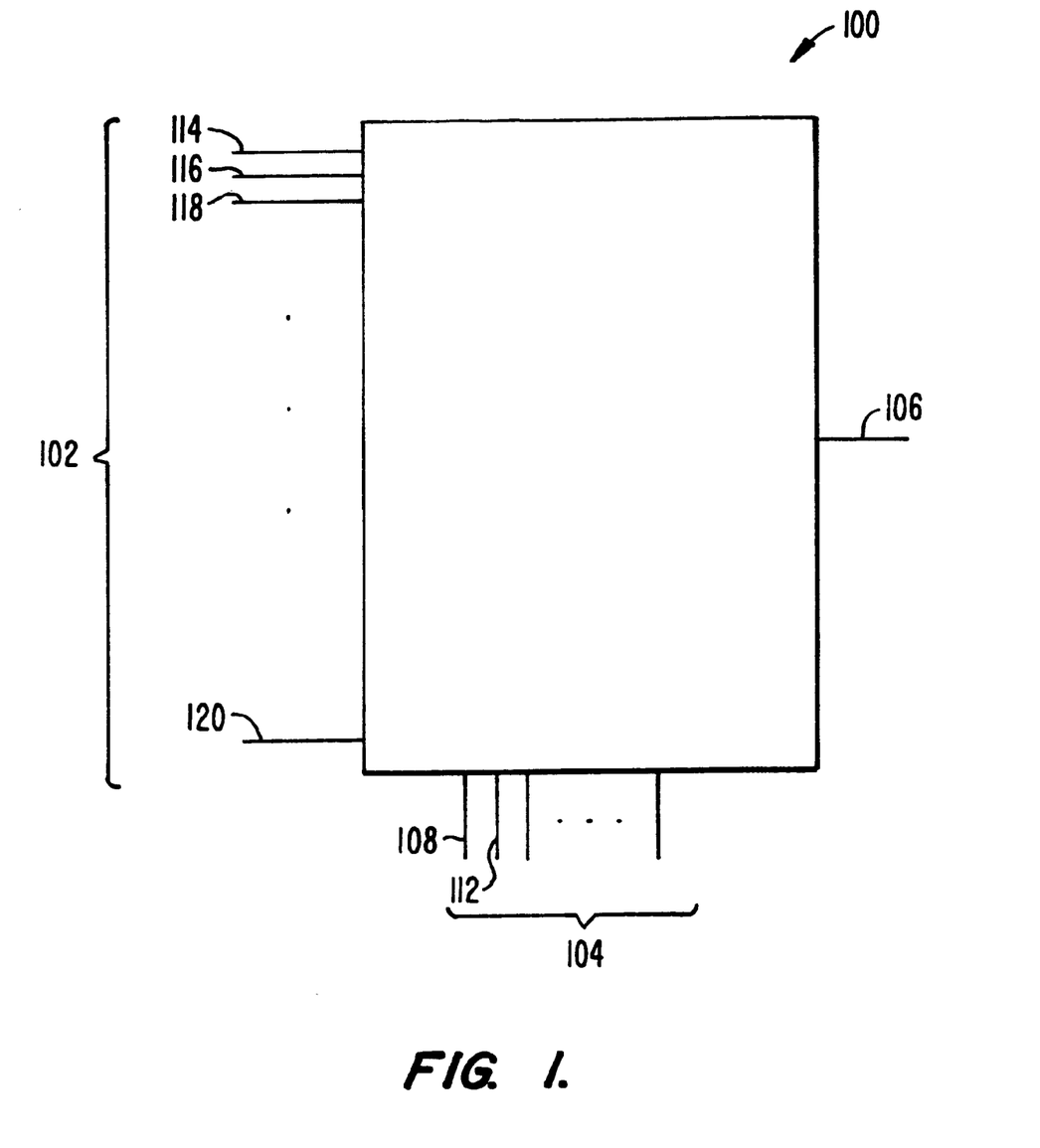
FIG. 1 is a block diagram of a look-up table showing signal inputs, select lines and an output.

FIG. 1 shows a block diagram of a look-up table 100 having signal inputs 102, select lines 104 and output 106. In operation, signal inputs 102 are applied with electrical signals in the form of, e.g., digital data, represented by high and low voltages corresponding, respectively, to 1's and 0's. Select lines 104 are similarly applied with high or low signals. The specific pattern of high or low signals at select lines 104 determines which of signal inputs 102 is connected to output 106. Once the connection is made between a signal input and the output, or, equivalently, a signal is selected and "passed" to the output, the passed signal is then available at the output after a short delay. Signal inputs are, typically, outputs from a memory element such as random access memory (RAM) or read-only memory (ROM).

As an example, assume that only select lines 108 and 112 are used. Further, assume that there are only four signal inputs 102. A common operation of the look-up table is then as follows: When select line 108 and select line 112 are both low, input 114 is passed to output 106. When select line 108 is low and select line 112 is high, input 116 is passed to output 106. When select line 108 is high and select line 112 is low, input 118 is passed to output 106. Finally, when select line 108 and select line 112 are both high, signal input 120 is passed to output 106. Thus, by using a binary numbering scheme at the select lines 104, signal inputs are passed to the output according to their number corresponding with their position from top to bottom in FIG. 1.

Figure 2:
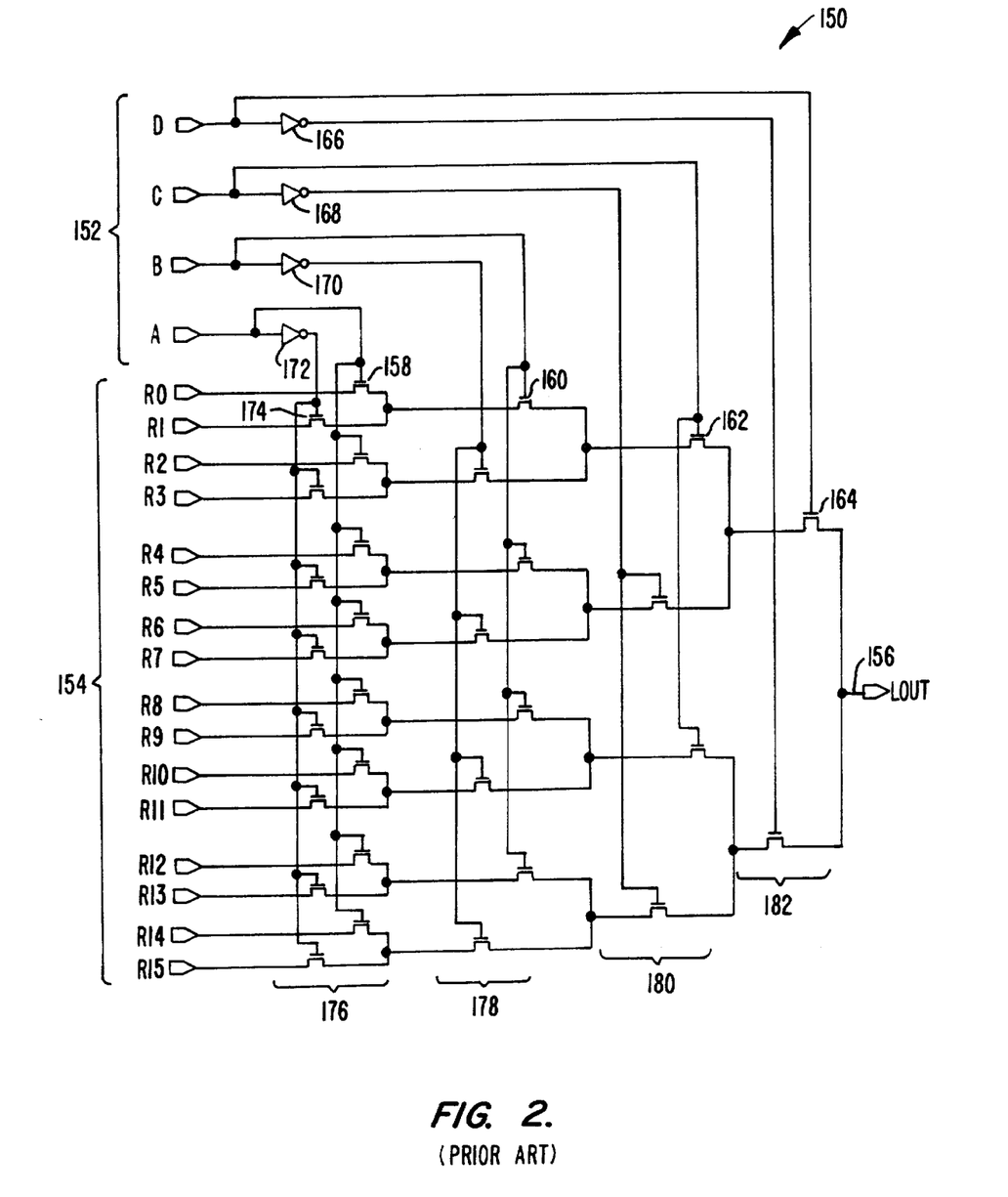
FIG. 2 is a prior art look-up table circuit.

FIG. 2 is a schematic diagram of a prior art look-up table circuit. In FIG. 2, look-up table circuit 150 includes select lines A, B, C and D at 152, signal inputs R0–15 at 154 and outputs, LOUT, at 156.

In the circuit of FIG. 2, voltages in the form of digital signals are applied to signal inputs 154 and select lines 152. For example, in a typical implementation, the voltages may correspond to 0 volts for a "low" and 5 volts for a "high." With a low voltage corresponding to a "0" binary digit and a high voltage corresponding to a "1" binary digit there are 16 possible combinations of voltages that can be applied to select lines 152 to select one of the 16 signal inputs 154 as shown in Table I below.

TABLE I

| DCBA | LOUT |
|------|------|
| 1111 | R0 |
| 1110 | R1 |
| 1101 | R2 |
| 1100 | R3 |
| 1011 | R4 |
| 1010 | R5 |
| 1001 | R6 |
| 1000 | R7 |
| 0111 | R8 |
| 0110 | R9 |
| 0101 | R10 |
| 0100 | R11 |
| 0011 | R12 |
| 0010 | R13 |
| 0001 | R14 |
| 0000 | R15 |

As shown in Table I, where select lines A, B, C and D are each supplied with a high voltage, the signal input R0 is the signal seen at the output 156, LOUT. This can be verified by tracing signal input R0 to transistor 158. Since select line A is high, transistor 158 will be on and signal input R0 will be passed to transistor 160. Since select line B is high, signal input R0 will further be passed to transistor 162. Likewise, select lines C and D are high so that transistors 162, 164 will pass signal input R0 to LOUT at 156.

The transistors are grouped into four stages corresponding to the order in which a signal passes through the transistors. First stage 176 includes transistor 158, second stage 178 includes transistor 160, third stage 180 includes transistor 162 and fourth stage 182 includes transistor 164.

In the circuit of FIG. 2, each of the transistors 152, 160, 162 and 164 that passes signal input R0 to LOUT introduces a delay referred to as a "transistor delay." In a typical metal-oxide-semiconductor ("MOS") implementation, a single transistor delay is about 0.3 nS. Thus, the total propagation delay through the circuit of FIG. 2 is 1.2 nS.

A second example to illustrate the performance of the look-up table circuit of FIG. 2 assumes that the select lines have the value "1110" so that select lines D, C and B are high while select line A is low. This means that signal input R1 will be passed to LOUT. However, in order for signal input R1 to be passed to LOUT, transistor 174 must be on. Since select line A is low at the input to inverter 172 the gate of transistor 174 will be high so that transistor 174 is on.

An MOS inverter such as inverter 166, 168, 170 or 172 each has an inverter delay of about 0.5 Ns. In the cases where an inverted select line signal is used to pass a signal input, the delay of the inverter must be taken into account. Thus, where signal input R1 is passed through transistor 174 by enabling the gate of transistor 174 with the output of inverter 172, the delay in the first stage is the time required to turn transistor 174 on (0.5 nS) plus the transistor delay time in passing the signal from the source to the drain (0.3 nS). This gives a total time through a first stage transistor with an inverted select line signal at its gate of 0.8 nS.

The inverter delay of 0.5 nS is not a factor in later stages 2, 3 or 4 since after the first 0.5 nS of operation of the circuit the output of each inverter is available. This is because the select line signals propagate through the inverters "concurrently" or "in parallel." Thus, later stages only introduce a single transistor delay of 0.3 Ns. This means that the worst case total delay in passing a signal input to the output is about 1.7 nS. The general "best case" delay, for purposes of this discussion, is about 1.2 nS which occurs when a signal is passed through transistors that do not have an inverted select line controlling the transistor gate in the first stage. (A "special best case" delay not considered in this discussion occurs when select line D goes from low to high while select lines A, B and C do not change. This introduces only a 0.3 nS delay through transistor 164 before the signal at output 156 is valid.)

Thus, it is seen in the prior art circuit of FIG. 2 that the delay in selecting a signal and making the signal available at the output, LOUT, is in the range of 1.2 nS to 1.7 nS. Naturally, it is desirable to reduce this delay as much as possible.

SUMMARY OF THE INVENTION

The present invention is a look-up table circuit that provides for a reduced delay time in selecting and passing a signal input to the output. The invention includes combinational means such as NOR gates to derive signals based on two or more select lines. The output of the combinational means is used to enable transistors to pass the selected signal to the output.

A preferred embodiment implements a 16 input look-up table by having two of the four select lines used to derive inputs to four NOR gates. The resulting circuit requires only three transistor stages and thus reduces the delay time over prior art circuits such as the circuit of FIG. 2.

DESCRIPTION OF THE PREFERRED EMBODIMENT

Figure 3:
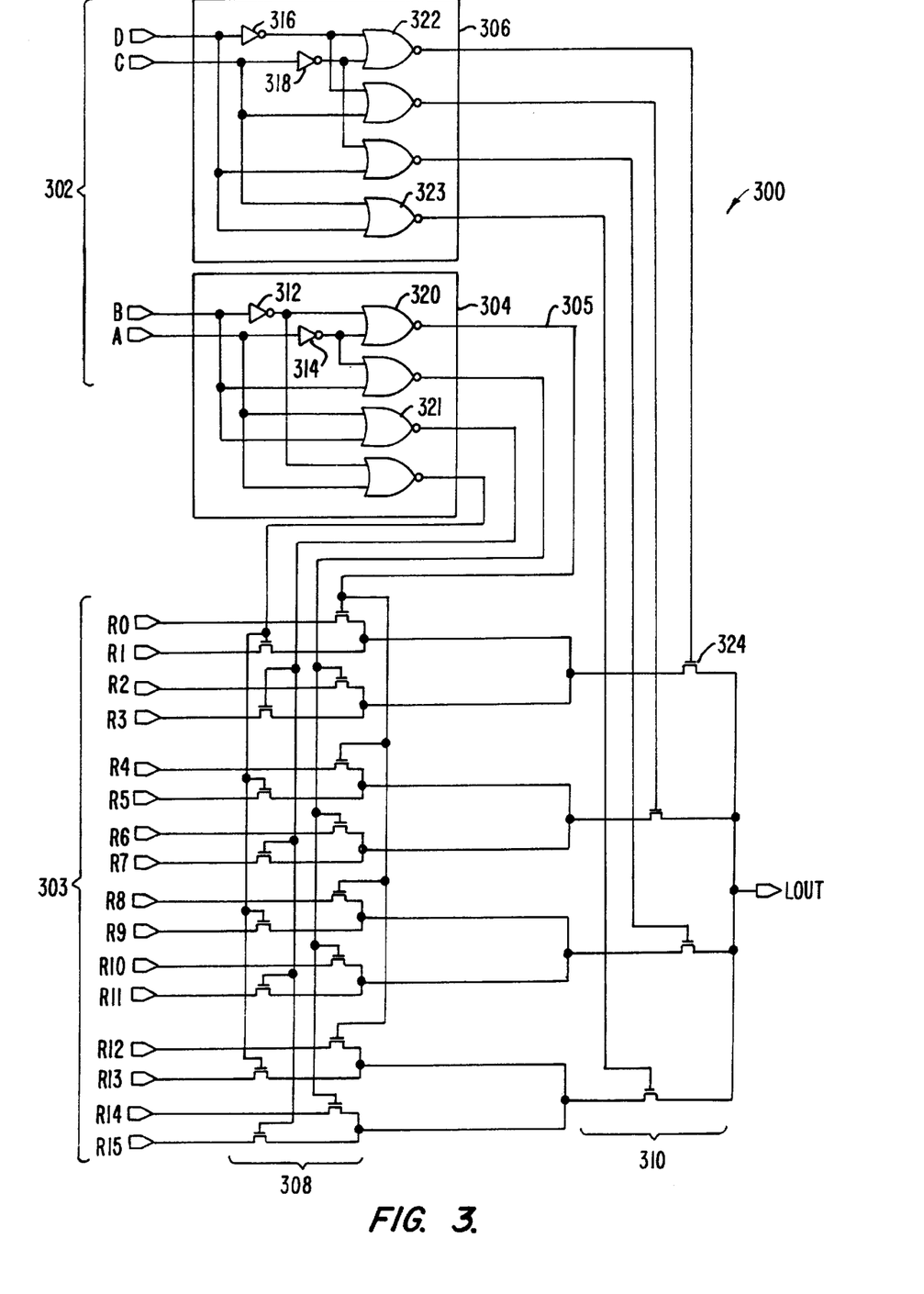
FIG. 3 shows a look-up table circuit of the present invention having two transistor stages.

FIG. 3 shows a first implementation of a look-up table circuit of the present invention. Note that select lines 302 labeled A, B, C and D are inputs to combinational subcircuits 304 and 306 and there are only two transistor stages 308 and 310. Subcircuits 304 and 306 output enable signals coupled to the gates of first and second stage transistors to turn these transistors on or off. The circuit of FIG. 3 performs according to Table I, above, as discussed in connection with FIG. 2.

To illustrate the performance of FIG. 3 assume that select lines A, B, C and D are all high. NOR gates such as 320 of subcircuit 304 will output a high signal only when both of the inputs to the NOR gate are low. Since select lines A and B are both high, it is shown from the schematic of subcircuit 304 in FIG. 3 that only NOR gate 320 will output a high signal since each of the other NOR gates in subcircuit 304 has as an input either uninverted select line A or uninverted select line B. Thus, four of the signal inputs, namely, R0, R4, R8 and R12 are passed through first stage 308 of FIG. 3.

Similar to subcircuit 304, subcircuit 306 includes four NOR gates whose inputs are connected to signals derived from the select lines. In subcircuit 306, since select lines C and D are both high, NOR gate 322 is the only NOR gate outputing a high signal. This means that only transistor 324 will have a high voltage at its gate and will pass its signal to LOUT. This passed signal is R0.

It is similarly shown that other combinations of high and low voltages on select lines A, B, C and D will result in a different signal input being passed to the output in accordance with Table I above.

Note that the total delay of the circuit of FIG. 3 differs from the prior art circuit of FIG. 2. Each signal input 303 only passes through two transistor stages before reaching the output, LOUT, and, hence, there are only two transistor delays. However, there is a longer delay in obtaining enable signals from the subcircuits 304 and 306 to turn the transistors on. In the worst case an enable signal such as enable signal 305 requires an inverter gate delay and a NOR gate delay before enable signal 305 is valid. As discussed above, an inverter delay is approximately 0.5 nS. A NOR gate delay is also approximately 0.5 nS. This means that the worst case delay for a valid enable signal, such as enable signal 305, is 1.0 nS. The worst case delay for a signal to propagate through first stage 308 is, therefore, about 1.3 nS.

The propagation delay through second stage 310 of FIG. 3 will be only one transistor delay since, for example, by the time the first stage delay output is valid at transistor 324 the signal at the gate of transistor 324 is also valid since the combinational means implemented by subcircuit 306 operates in parallel with subcircuit 304. This means that there is no delay introduced into the second stage as a result of waiting for signals at the gates of the transistors in second stage 310 to become valid. The delay added by second stage 310 is about 0.3 nS giving a total worst case delay time of 1.6 nS.

The best case delay through the first stage occurs when select lines A and B are both low so that the controlling enable signal is generated by NOR gate 321 which doesn't use outputs from inverters 312 or 314. In this case, the delay through first stage 308 is 0.8 nS. Through the second stage, the best case delay is 1.1 nS which assumes the case where the enable signal from subcircuit 306 is not generated from a NOR gate with inputs coupled to the inverted select lines, i.e., select lines C and D are both low. In computing the second stage delay, note that the delay through NOR gate 323 occurs in parallel with the delay through NOR gate 321 and, hence, does not contribute to the total delay.

It is thus shown that, in the look-up table circuit of FIG. 3, the total delay in passing the signal input to the output is in the range 1.1 nS to 1.6 nS. This is the better than the prior art circuit of FIG. 2.

Figure 4:
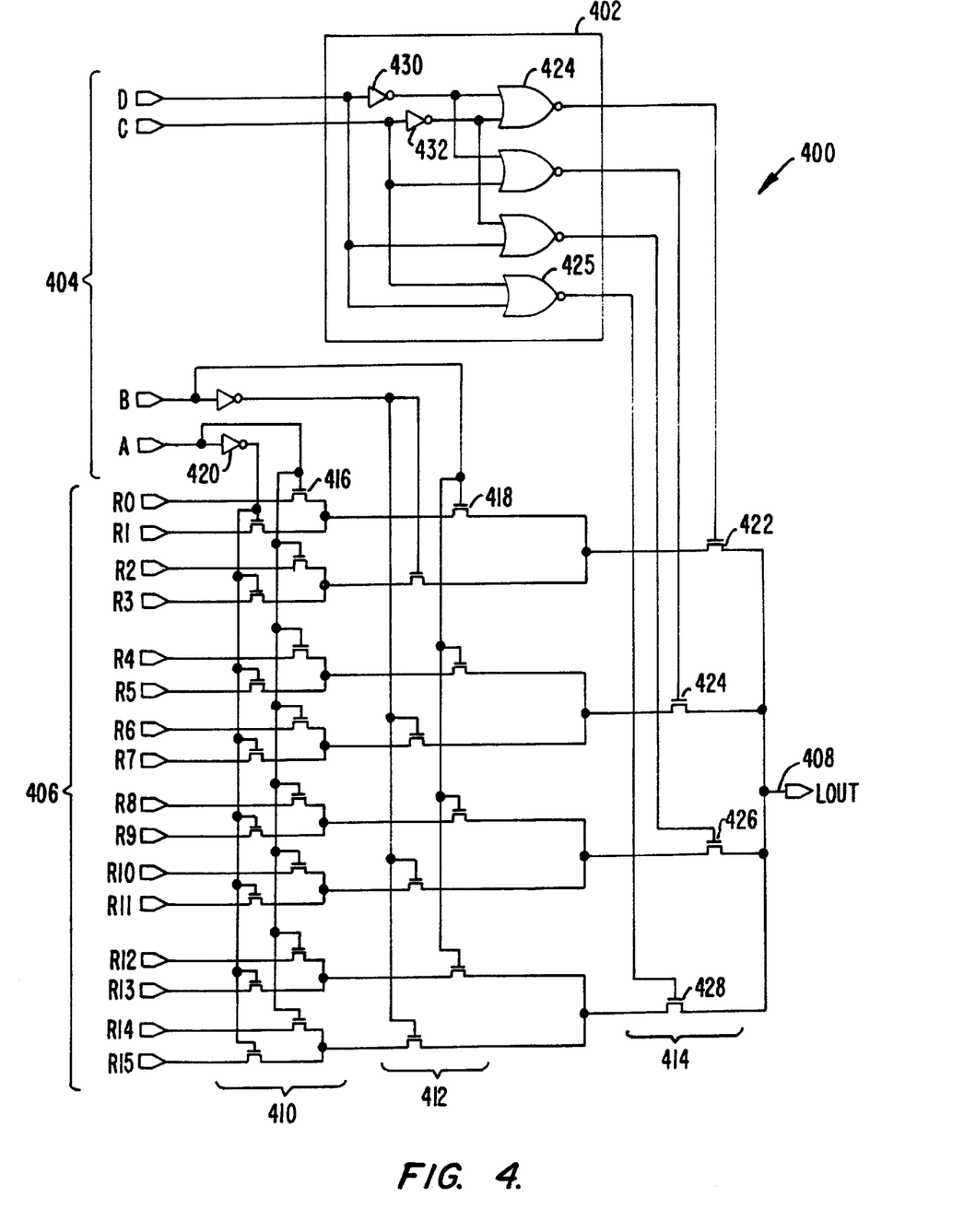
FIG. 4 is a look-up table circuit of the present invention having three transistor stages.

FIG. 4 shows look-up table circuit 400 that is another, preferred, embodiment of the present invention. The embodiment of FIG. 4 only uses one subcircuit 402 instead of the two subcircuits used in the circuit of FIG. 3 above. As before, the look-up table circuit of FIG. 4 includes select lines at 404, signal inputs at 406 and an output at 408. The circuit of FIG. 4 has three transistor stages, first stage 410, second stage 412 and third stage 414. The circuit of FIG. 4 operates in accordance with Table I above.

To illustrate the performance of FIG. 4, assume that select lines A and B are high. This results in signal inputs R0, R2, R4, R6, R8, R10, R12 and R14 in being passed through first stage 410. The time required for the signals to propagate through the first stage is one transistor delay, or 0.3 nS.

Second stage 412 introduces, at most, another 0.3 nS single transistor delay since the inverted select line B enabling signals will already be present at stage two having been concurrently derived with select line A signals. In the example, signals R0, R4, R8 and R12 are passed through the second stage with a delay of 0.6 nS.

At third stage 414, the enable signals to turn on transistors 422, 424, 426 and 428 are the outputs of subcircuit 402. Subcircuit 402, like subcircuits 304 and 306, is a combinational circuit using inverters and NOR gates to generate enable signals for transistors in stage three at 414. The minimum delay for valid enable signals is when select lines C and D are both low. This results in a high signal at the output of NOR gate 425 after 0.5 nS delay. Since this 0.5 nS delay is concurrent with the delay through the first and second stages, the delay attributable to NOR gate 425 is inconsequential. The high signal output from NOR gate 425 is applied to the gate of transistor 428 to select R12, in the present example, after a transistor delay of 0.3 nS. Thus, the best case delay, which occurs when select lines C and D are low and select lines A and B are high, is 0.9 nS for the circuit of FIG. 4.

To analyze the worst case delay for the circuit of FIG. 4, assume that select line A is low. Then inverter 420 causes a delay of about 0.5 nS resulting in a 0.8 nS worst case delay through the first stage. The worst case propagation delay in combined stages one and two is therefore 1.1 nS. The maximum delay for valid enable signals appearing at the outputs of subcircuit 402 is 1.0 nS, when both select lines C and D are high. However, since the delay from stages one and two is 1.1 nS in the worst case, the delay attributable to subcircuit 402 does not affect the worst case total delay. In other words, the outputs of subcircuit 402 will be valid by the time the selected signal input has propagated to the third stage transistors at 414. Thus, stage three at 414 will add 0.3 nS delay for a total of 1.4 nS total delay time in the worst case. This means that with all select lines high, the time to propagate R0 to LOUT is 1.4 nS.

Thus, the circuit of FIG. 4 provides a look-up table circuit with delay times in the range of 0.9 nS to 1.4 nS. This is a marked improvement over the prior art.

Note that other combinational means may be used in place of subcircuit 402 of FIG. 4 and subcircuits 304 and 306 of FIG. 3. For example, NOR gate 424 can be substituted with an AND gate with inputs connected directly to select lines C and D without going through inverters 430 and 432. However, inverters and NOR gates are the preferred devices since they are easier and more economical to fabricate on a semiconductor chip.

In the foregoing specification, the invention has been described with reference to a specific, exemplary embodiment thereof. It will, however, be evident that various modifications and changes may be made there onto without departing from the broader spirit and scope of the invention as set forth in the appended claims. The figures in this specification apply for a typical CMOS process and will be different depending on the technology used to fabricate the look-up table device. Other transistor technologies such as bipolar may be used to implement the circuits of the present invention. Further, the circuit may be operated at voltages other than those specifically disclosed herein without departing from the scope of the invention. The circuit may also be used to implement a "multiplexer" function. Many such changes or modifications will be readily apparent to one of ordinary skill in the art.

The specifications and drawings are, accordingly, to be regarded in an illustrative rather than a restrictive sense, the invention being limited only by the provided claims.

What is claimed is:

1. A look-up table circuit, the circuit including a plurality of signal inputs, a circuit output and a plurality of select lines, wherein one of the signal inputs is passed to the circuit output in response to voltages placed on the select lines, the circuit comprising:

a first pass transistor coupled to the first signal input for selectively passing the first signal input to a first node;

a second pass transistor coupled to the second signal input for selectively passing the second signal input to the first node;

a select line coupled to control electrodes of the first and second transistors so that when one of the transistors is on the other transistor is off;

one or more combinational gates, coupled to two or more select lines, for outputting an enable signal in response to the voltages on the two or more select lines; and one or more pass transistors coupled between the circuit output and the first node for selectively passing a signal at the first node, the one or more pass transistors coupled to the enable signal, the one or more pass transistors enabled by the enable signal to allow the signal at the first node to pass to the circuit output when the enable signal is at a predetermined voltage level, wherein at least one signal input is selectively passed through the one or more pass transistors to the circuit output.

2. A look-up table circuit, the circuit including first, second, third and fourth signal inputs, an output, and first, second, third and fourth select lines, wherein one of the signal inputs is passed to the circuit output in response to voltages placed on the select lines, the circuit further comprising:

first, second, third and fourth transistors coupled respectively to the first, second, third, and fourth signal inputs;

a control electrode of the first transistor and a control electrode of the third transistor coupled to the first select lines;

a first inverter having an input coupled to the first select line, an output of the first inverter coupled to a control electrode of the second transistor and a control electrode of the fourth transistor;

a first node coupled to the first and second transistors so that when the control electrode of the first transistor is activated, the first signal input is coupled to the first node and when the control electrode of the second transistor is activated, the second signal input is coupled to the first node;

a second node coupled to the third and fourth transistors so that when the control electrode of the third transistor is activated, the third signal input is coupled to the second node and when the control electrode of the fourth transistor is activated the fourth signal input is coupled to the second node;

a fifth transistor coupled to the first node, a control electrode of the fifth transistor coupled to the second select line;

a sixth transistor coupled to the second node, a control electrode of the sixth transistor coupled to the second select line through a second inverter, the second inverter having an input coupled to the second select line and an output coupled to the control electrode of the sixth transistor;

a third node coupled to the fifth and sixth transistors so that when the control electrode of the fifth transistor is activated, the first node is electrically coupled to the third node and when the control electrode of the sixth transistor is activated, the second node is electrically coupled to the third node;

a seventh transistor coupled between the third node and the signal output; and a combinational circuit for outputting an enable signal in response to the voltages placed on the third and fourth select lines, the inputs of the combinational circuit coupled to the third and fourth select lines, the enable signal coupled to the control electrode of the seventh transistor.

3. The circuit of claim 2, wherein the combinational circuit comprises a combinational gate, wherein the output of the combinational gate is coupled to the enable signal and wherein the inputs of the combinational gate are coupled to the third and fourth select lines.

4. The circuit of claim 3, wherein the combinational gate is a NOR gate.

5. A look-up table circuit for an integrated circuit comprising:
   a first level of pass transistors comprising:
     a first pass transistor;
     a second pass transistor;
     a third pass transistor; and
     a fourth pass transistor, wherein the first pass transistor, second pass transistor, third pass transistor, and fourth pass transistor are coupled to a look-up table output node;
   a second level of pass transistors comprising:
     a first pass transistor;
     a second pass transistor;
     a third pass transistor; and
     a fourth pass transistor, wherein the first pass transistor, second pass transistor, third pass transistor, and fourth pass transistor of the second level are coupled to a transistor in the first level of pass transistors; and
   a plurality of NOR gates coupled to the transistors in the first level of pass transistors and the second level of pass transistors.

6. A look-up table circuit for an integrated circuit comprising:
   a first level of pass transistors comprising:
     a first pass transistor;
     a second pass transistor;
     a third pass transistor; and
     a fourth pass transistor, wherein the first pass transistor, second pass transistor, third pass transistor, and fourth pass transistor are coupled to a look-up table output node;
   a second level of pass transistors comprising:
     a first pass transistor;
     a second pass transistor;
     a third pass transistor; and
     a fourth pass transistor, wherein the first pass transistor, second pass transistor, third pass transistor, and fourth pass transistor are coupled to one transistor in the first level of pass transistors;
   a plurality of NOR gates coupled to the transistors in the first level of pass transistors;
   a first plurality of selection inputs coupled to the pass transistors in the second level of pass transistors; and
   a second plurality of selection inputs coupled to inputs of the plurality of NOR gates.

7. The look-up table circuit of claims 5 or 6 wherein each of a plurality of the second level of pass transistors couples to a different signal input.

8. The look-up table circuit of claims 5 or 6 wherein the plurality of NOR gates comprises:
   a first NOR gate coupled to the first pass transistor of the first level of pass transistors;
   a second NOR gate coupled to the second pass transistor of the first level of pass transistors;
   a third NOR gate coupled to the third pass transistor of the first level of pass transistors; and
   a fourth NOR gate coupled to the fourth pass transistor of the first level of pass transistors.

9. The look-up table circuit of claim 5 wherein the plurality of NOR gates comprises:
   a first NOR gate coupled to the first pass transistor of the second level of pass transistors;
   a second NOR gate coupled to the second pass transistor of the second level of pass transistors;
   a third NOR gate coupled to the third pass transistor of the second level of pass transistors; and
   a fourth NOR gate coupled to the fourth pass transistor of the second level of pass transistors.

10. A programmable integrated circuit comprising look-up table circuitry as recited in claims 5 or 6.

11. A look-up table circuit for an integrated circuit comprising:
   a first stage of pass transistors, each transistor in the first stage of pass transistors is directly coupled to an output of the look-up table circuit;
   a second stage of pass transistors, each transistor in the second stage of pass transistors is directly coupled to at least one transistor in the first stage of pass transistors;
   a first decoding block coupling to the first stage; and
   a second decoding block coupling to the second stage.

12. The look-up table circuit of claim 11 wherein the first decoding block comprises:
   a first NOR gate coupled to a first pass transistor of the first stage;
   a second NOR gate coupled to a second pass transistor of the first stage;
   a third NOR gate coupled to a third pass transistor of the first stage; and
   a fourth NOR gate coupled to a fourth pass transistor of the first stage.

13. The look-up table circuit of claims 11 or 12 wherein the second decoding block comprises:
   a first NOR gate coupled to a first pass transistor of the second stage;
   a second NOR gate coupled to a second pass transistor of the second stage;
   a third NOR gate coupled to a third pass transistor of the second stage; and
   a fourth NOR gate coupled to a fourth pass transistor of the second stage.

14. The look-up table circuit of claim 11 wherein logical signal inputs are input to the second stage of pass transistors.

15. A look-up table circuit for an integrated circuit comprising:
   a first level of pass transistors comprising:
     a first pass transistor;
     a second pass transistor;
     a third pass transistor; and
     a fourth pass transistor, wherein the first pass transistor, second pass transistor, third pass transistor, and fourth pass transistor of the first level are each directly coupled to a look-up table output node; and
   a second level of pass transistors comprising:
     a first pass transistor; and
     a second pass transistor, wherein the first and second pass transistors of the second level are each directly coupled to a transistor in the first level of pass transistors; and a third level of pass transistors comprising:
   a first pass transistor coupled to a first signal input; and
   a second pass transistor coupled to a second signal input, wherein in the first and second pass transistors of the third level are each directly coupled to a transistor in the second level of pass transistors.

16. The look-up table circuit of claim 15 further comprising:
   a plurality of NOR gates coupled to enable the first level of pass gates in response to a first select signal and a second select signal;
   a third select signal coupled to enable the second level of pass gates; and
   a fourth select signal coupled to enable the third level of pass gates.

17. The look-up table circuit of claim 15 further comprising:
   a first NOR gate coupled to a first pass transistor of the first level;
   a second NOR gate coupled to a second pass transistor of the first level;
   a third NOR gate coupled to a third pass transistor of the first level; and
   a fourth NOR gate coupled to a fourth pass transistor of the first level.

18. A look-up table circuit, including:
   a first stage including a set of N input nodes and a sub-set of intermediate nodes, the first stage configured to receive input signals at the N input nodes respectively and to pass a selected sub-set of the input signals to the intermediate nodes;
   a first decoder, coupled to the first stage, and configured to select the sub-set of input signals in response to the state of a first group of select signals, the first decoder further configured to provide first enable signals to the first stage to enable the first stage to pass the selected sub-set of input signals to the intermediate nodes, the first decoder including a plurality of logic gates coupled to receive all the possible combinations of the first group of select signals and their complements respectively;
   a second stage, coupled between the intermediate nodes of the first stage and an output node of the look-up table circuit, the second stage configured to receive the selected sub-set of the input signals at the intermediate nodes and to pass a selected one input signal among the sub-set of input signals to the output node; and
   a second decoder, coupled to the second stage, and configured to select the selected one input signal among the sub-set of input signals in response to the state of a second group of select signals, the second decoder further configured to provide second enable signals to the second stage to enable the second stage to pass the selected one input signal to the output node.

19. The look-up table circuit of claim 18, wherein the first stage includes a set of N pass transistors, each one of the N pass transistors being coupled between a selected one of the intermediate nodes and the N input nodes respectively.

20. The look-up table circuit of claim 18, wherein the first decoder includes a plurality of NOR gates.

21. The look-up table circuit of claim 18, wherein the second stage includes a plurality of pass transistors coupled between the output node and the intermediate nodes respectively.

22. The look-up table circuit of claim 21, wherein the second decoder activates a different one of the second enable signals in response to each possible combination of the second group of select signals.

23. The look-up table circuit of claim 18, wherein the second decoder includes a plurality of logic gates coupled to receive all the possible combinations of the second group of select signals and their complements respectively.

24. The look-up table circuit of claim 23, wherein the second decoder includes a plurality of NOR gates.

25. A look-up table circuit for an integrated circuit comprising:
   a first stage of pass transistors coupled to an output of the look-up table circuit;
   a second stage of pass transistors coupled to the first stage of pass transistors;
   a first decoding block coupling to the first stage, the first decoding block comprising:
      a first NOR gate coupled to a first pass transistor of the first stage;
      a second NOR gate coupled to a second pass transistor of the first stage;
      a third NOR gate coupled to a third pass transistor of the first stage; and
      a fourth NOR gate coupled to a fourth pass transistor of the first stage; and
   a second decoding block coupling to the second stage.

26. A look-up table circuit for an integrated circuit comprising:
   a first stage of pass transistors coupled to an output of the look-up table circuit;
   a second stage of pass transistors coupled to the first stage of pass transistors;
   a first decoding block coupling to the first stage; and
   a second decoding block coupling to the second stage, the second decoding block comprising:
      a first NOR gate coupled to a first pass transistor of the second stage;
      a second NOR gate coupled to a second pass transistor of the second stage;
      a third NOR gate coupled to a third pass transistor of the second stage; and
      a fourth NOR gate coupled to a fourth pass transistor of the second stage.

27. A look-up table circuit for an integrated circuit comprising:
   a first level of pass transistors comprising:
      a first pass transistor;
      a second pass transistor;
      a third pass transistor; and
      a fourth pass transistor, wherein the first pass transistor, second pass transistor, third pass transistor, and fourth pass transistor of the first level are coupled to a look-up table output node;
   a second level of pass transistors comprising:
      a first pass transistor; and
      a second pass transistor, wherein the first and second pass transistors of the second level are coupled to a transistor in the first level of pass transistors;
   a third level of pass transistors comprising:
      a first pass transistor; and
      a second pass transistor, wherein in the first and second pass transistors of the third level are coupled to a transistor in the second level of pass transistors;
   a plurality of NOR gates coupled to enable the first level of pass gates in response to a first select signal and a second select signal;

a third select signal coupled to enable the second level of pass gates; and a fourth select signal coupled to enable the third level of pass gates.

28. A look-up table circuit for an integrated circuit comprising:

a first level of pass transistors comprising:
a first pass transistor;
a second pass transistor;
a third pass transistor; and
a fourth pass transistor, wherein the first pass transistor, second pass transistor, third pass transistor, and fourth pass-transistor of the first level are coupled to a look-up table output node;

a second level of pass transistors comprising:
a first pass transistor; and
a second pass transistor, wherein the first and second pass transistors of the second level are coupled to a transistor in the first level of pass transistors;

a third level of pass transistors comprising:
a first pass transistor; and
a second pass transistor, wherein in the first and second pass transistors of the third level are coupled to a transistor in the second level of pass transistors;

a first NOR gate coupled to a first pass transistor of the first level;

a second NOR gate coupled to a second pass transistor of the first level;

a third NOR gate coupled to a third pass transistor of the first level; and a fourth NOR gate coupled to a fourth pass transistor of the first level.

29. A look-up table circuit, including:

a first stage including a set of N input nodes and a sub-set of intermediate nodes, the first stage configured to receive input signals at the N input nodes respectively and to pass a selected sub-set of the input signals to the intermediate nodes;

a first decoder, coupled to the first stage, and configured to select the sub-set of input signals in response to the state of a first group of select signals, the first decoder further configured to provide first enable signals to the first stage to enable the first stage to pass the selected sub-set of input signals to the intermediate nodes, the first decoder including a plurality of NOR gates;

a second stage, coupled between the intermediate nodes of the first stage and an output node of the look-up table circuit, the second stage configured to receive the selected sub-set of the input signals at the intermediate nodes and to pass a selected one input signal among the sub-set of input signals to the output node; and a second decoder, coupled to the second stage, and configured to select the selected one input signal among the sub-set of input signals in response to the state of a second group of select signals, the second decoder further configured to provide second enable signals to the second stage to enable the second stage to pass the selected one input signal to the output node.

30. A look-up table circuit, including:

a first stage including a set of N input nodes and a sub-set of intermediate nodes, the first stage configured to receive input signals at the N input nodes respectively and to pass a selected sub-set of the input signals to the intermediate nodes;

a first decoder, coupled to the first stage, and configured to select the sub-set of input signals in response to the state of a first group of select signals, the first decoder further configured to provide first enable signals to the first stage to enable the first stage to pass the selected sub-set of input signals to the intermediate nodes;

a second stage, coupled between the intermediate nodes of the first stage and an output node of the look-up table circuit, the second stage configured to receive the selected sub-set of the input signals at the intermediate nodes and to pass a selected one input signal among the sub-set of input signals to the output node; and a second decoder, coupled to the second stage, and configured to select the selected one input signal among the sub-set of input signals in response to the state of a second group of select signals, the second decoder further configured to provide second enable signals to the second stage to enable the second stage to pass the selected one input signal to the output node, the second decoder including a plurality of logic gates coupled to receive all the possible combinations of the second group of select signals and their complements respectively.

31. A look-up table circuit, including:

a first stage including a set of N input nodes and a sub-set of intermediate nodes, the first stage configured to receive input signals at the N input nodes respectively and to pass a selected sub-set of the input signals to the intermediate nodes;

a first decoder, coupled to the first stage, and configured to select the sub-set of input signals in response to the state of a first group of select signals, the first decoder further configured to provide first enable signals to the first stage to enable the first stage to pass the selected sub-set of input signals to the intermediate nodes;

a second stage, coupled between the intermediate nodes of the first stage and an output node of the look-up table circuit, the second stage configured to receive the selected sub-set of the input signals at the intermediate nodes and to pass a selected one input signal among the sub-set of input signals to the output node; and a second decoder, coupled to the second stage, and configured to select the selected one input signal among the sub-set of input signals in response to the state of a second group of select signals, the second decoder further configured to provide second enable signals to the second stage to enable the second stage to pass the selected one input signal to the output node, the second decoder including a plurality of NOR gates.

32. A programmable logic device comprising a look-up table circuit, the look-up table circuit including a plurality of signal inputs, a circuit output and a plurality of select lines, wherein one of the signal inputs is passed to the circuit output in response to voltages placed on the select lines, the circuit comprising:

a first pass transistor coupled to the first signal input for selectively passing the first signal input to a first node;

a second pass transistor coupled to the second signal input for selectively passing the second signal input to the first node;

a select line coupled to control electrodes of the first and second transistors so that when one of the transistors is on the other transistor is off;

one or more combinational gates, coupled to two or more select lines, for outputting an enable signal in response to the voltages on the two or more select lines; and one or more pass transistors coupled between the circuit output and the first node for selectively passing a signal at the first node, the one or more pass transistors coupled to the enable signal, the one or more pass transistors enabled by the enable signal to allow the signal at the first node to pass to the circuit output when the enable signal is at a predetermined voltage level, wherein at least one signal input is selectively passed through the one or more pass transistors to the circuit output.

33. A look-up table circuit, including:

a first stage including a set of N input nodes and M intermediate output nodes, the first stage configured to receive input signals at the N input nodes respectively and to pass a selected subset of the input signals to the M intermediate output nodes in response to a first group of enable signals, wherein M is less than N;

a second stage coupled between the M intermediate output nodes and a look-up table output node, the second stage configured to receive the input signals at the M intermediate output nodes and to pass a selected input signal among the received input signals to the look-up table output node in response to a second group of enable signals;

a first logic circuit coupled with the first stage, the first logic circuit configured to receive a first group of select signals and to generate the first group of enable signals based on the first group of select signals, the generated first group of enable signals being passed to the first stage; and a second logic circuit coupled with the second stage, the second logic circuit configured to receive a second group of select signals and to generate the second group of enable signals based on the second group of select signals, the generated second group of enable signals being passed to the second stage, the second logic circuit including a plurality of NOR gates.

34. The look-up table circuit of claim 33 wherein:

the first stage comprises:
 a first set of transistors coupled to the set of N input nodes and to a set of K subset nodes, the first set of transistors configured to receive the input signals at the N input nodes respectively and to pass a selected subset of the input signals to the K subset nodes in response to signals from the first group of enable signals, wherein K is greater than M and less than N; and
 a second set of transistors coupled to the set of K subset nodes and to the M intermediate output nodes, the second set of transistors configured to receive the input signals at the K subset nodes respectively and to pass a selected subset of the input signals to the M intermediate output nodes in response to signals from the first group of enable signals; and the second stage comprises:
 a third set of transistors coupled to the M intermediate output nodes and to the look-up table output node, the third set of transistors configured to receive the input signals at M intermediate output nodes and to pass the selected input signal to the look-up table output node in response to the second group of enable signals.

35. The look-up table circuit of claim 33, wherein:

the first logic circuit includes a plurality of NOR gates;

the first stage further comprises a first set of transistors coupled to the set of N input nodes and to the set of M intermediate output nodes, the first set of transistors configured to receive the input signals at the N input nodes respectively and to pass a selected subset of the input signals to the M intermediate output nodes in response to signals from the first group of enable signals; and the second stage comprises a second set of transistors coupled to the M intermediate output nodes and to the look-up table output node, the second set of transistors configured to receive the input signals at M intermediate output nodes and to pass the selected input signal to the look-up table output node in response to the second group of enable signals.

* * * * *